US008674769B2

(12) United States Patent
Xie et al.

(10) Patent No.: US 8,674,769 B2
(45) Date of Patent: Mar. 18, 2014

(54) POWER AMPLIFIER PROTECTION CIRCUIT, COMMUNICATION DEVICE, AND METHOD

(71) Applicant: Huawei Technologies Co., Ltd., Shenzhen (CN)

(72) Inventors: Lunchen Xie, Shenzhen (CN); Xiang Wei, Shenzhen (CN); Hua Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/904,822

(22) Filed: May 29, 2013

(65) Prior Publication Data

US 2013/0257543 A1 Oct. 3, 2013

Related U.S. Application Data

(63) Continuation of application No. PCT/CN2011/079325, filed on Sep. 5, 2011.

(30) Foreign Application Priority Data

Dec. 2, 2010 (CN) .......................... 2010 1 0571016

(51) Int. Cl.
*H03F 1/52* (2006.01)
(52) U.S. Cl.
USPC ..................................... 330/298; 330/207 P
(58) Field of Classification Search
USPC ..................... 330/298, 207 P, 10, 251, 207 A
See application file for complete search history.

(56) References Cited

U.S. PATENT DOCUMENTS

| 3,931,547 A | 1/1976 | Glogolja |
| 5,587,640 A | 12/1996 | Ek et al. |
| 7,167,055 B2 * | 1/2007 | Wong et al. .................. 330/298 |

(Continued)

FOREIGN PATENT DOCUMENTS

| CN | 101222208 A | 7/2008 |
| CN | 101378262 A | 3/2009 |

(Continued)

OTHER PUBLICATIONS

Written Opinion of the International Searching Authority in corresponding PCT Patent Application No. PCT/CN2011/079325 (Dec. 8, 2011).

(Continued)

*Primary Examiner* — Hieu Nguyen
(74) *Attorney, Agent, or Firm* — Leydig, Voit & Mayer, Ltd.

(57) ABSTRACT

Embodiments of the present application disclose a power amplifier protection circuit, communication device, and method, to protect a power amplifier when an abnormal signal, such as a burr or a pulse, occurs in a circuit. The method according to an embodiment of the present application comprises: detecting and comparing, by an input detection circuit, an abnormal signal in an input signal, outputting a protection control signal, and after processing performed by a delay circuit, controlling a power amplifier to be in an off state in a pulse width of the delayed protection control signal, so that the abnormal signal passes through the power amplifier when the power amplifier is in the off state, thereby preventing the power amplifier from burning, and achieving the effect of protecting the power amplifier.

20 Claims, 3 Drawing Sheets

(56) References Cited

U.S. PATENT DOCUMENTS

| | | |
|---|---|---|
| 7,486,144 B2 | 2/2009 | Mitzlaff et al. |
| 7,692,491 B2 | 4/2010 | Makihara et al. |
| 7,705,673 B2 * | 4/2010 | Teng et al. ............... 330/207 P |
| 7,760,027 B2 | 7/2010 | Murji et al. |
| 2008/0260185 A1 | 10/2008 | Tseng et al. |

FOREIGN PATENT DOCUMENTS

| | | |
|---|---|---|
| CN | 101557226 A | 10/2009 |
| CN | 102055412 A | 5/2011 |
| EP | 0982852 A2 | 3/2000 |

OTHER PUBLICATIONS

International Search Report in corresponding PCT Patent Application No. PCT/CN2011/079325 (Dec. 8, 2011).

Extended European Search Report in corresponding European Patent Application No. 11844132.8 (Oct. 1, 2013).

* cited by examiner

POWER AMPLIFIER PROTECTION CIRCUIT, COMMUNICATION DEVICE, AND METHOD

CROSS-REFERENCE TO RELATED APPLICATIONS

This application is a continuation of International Patent Application No. PCT/CN2011/079325, filed on Sep. 5, 2011, which claims priority to Chinese Patent Application No. 201010571016.X, filed Dec. 2, 2010, both of which are hereby incorporated by reference in its entireties.

FIELD OF THE APPLICATION

The present application relates to the electronic field, and in particular, to a power amplifier protection circuit, communication device, and method.

BACKGROUND OF THE APPLICATION

In communication base station devices of various standards, such as the global system for mobile communications (GSM, Global System for Mobile Communications), the code division multiple access (CDMA, Code Division Multiple Access), the wideband code division multiple access (WCDMA, Wideband Code Division Multiple Access), the time division-synchronous code division multiple access (TD-SCDMA, Time Division-Synchronous Code Division Multiple Access), the worldwide interoperability for microwave access (WiMax, Worldwide Interoperability for Microwave Access) and the long term evolution (LTE, Long Term Evolution), a power amplifier is required to amplify a signal, and the performance specification and engineering specification of a radio base station product directly depend on the performance of the power amplifier. Working in a nearly saturated state with high power, a power amplifier (especially, a final-stage power amplifier) is easily burned and may cause a series of serious consequences, for example, directly cause that a communication base station fails to work normally to interrupt a communication service, and the cost increases as a part of boards become unrepairable and thus scrapped.

In the prior art, the foregoing technical problem is mainly solved by detecting a final-stage signal amplitude to trigger the switching off of a preceding stage amplified circuit. The technical solution has a certain effect of protecting the power amplifier when an abnormal signal, such as a signal with continuous high power or a signal with a standing wave, occurs in the circuit, but when an abnormal signal, such as a burr and a pulse, occurs in the circuit, the technical solution has no effect of protecting the power amplifier.

SUMMARY OF THE APPLICATION

Embodiments of the present application provide a power amplifier protection circuit, a communication device, and a power amplifier protection method, which can protect a power amplifier and prevent the power amplifier from burning when an abnormal signal, such as a burr and a pulse, occurs in a circuit.

The power amplifier protection circuit provided by an embodiment of the present application includes: an input detection circuit, a delay circuit, and a control circuit. An input end of the input detection circuit is connected to a signal input end, and the input detection circuit is configured to detect an abnormal signal in an input signal, compare the abnormal signal with a preset reference level, and output a protection control signal if a pulse amplitude of the abnormal signal is higher than the reference level. An input end of the delay circuit is connected to an output end of the input detection circuit, and the delay circuit is configured to perform delay processing on the protection control signal. An input end of the control circuit is connected to an output end of the delay circuit, an output end of the control circuit is connected to an input end of a power amplifier, and the control circuit is configured to control the power amplifier to be in an off state in the pulse width of the protection control signal that has undergone the delay processing, so that the abnormal signal passes through the power amplifier when the power amplifier is in the off state.

The communication device provided by an embodiment of the present application includes: an input detection unit, configured to detect an abnormal signal in an input signal, compare the abnormal signal with a preset reference level, and output a protection control signal if a pulse amplitude of the abnormal signal is higher than the reference level; a delay unit, configured to perform delay processing on the protection control signal; a control unit, configured to control a power amplifier to be in an off state in the pulse width of the protection control signal that has undergone the delay processing, so that the abnormal signal passes through the power amplifier when the power amplifier is in the off state; and the power amplifier, configured to generate a power output to drive a load.

The power amplifier protection method provided by an embodiment of the present application includes: detecting an abnormal signal in an input signal; comparing the abnormal signal with a preset reference level and outputting a protection control signal if a pulse amplitude of the abnormal signal is higher than the reference level; performing delay processing on the protection control signal; and controlling the power amplifier to be in an off state in the pulse width of the protection control signal that has undergone the delay processing, so that the abnormal signal passes through the power amplifier when the power amplifier is in the off state.

It can be seen from the foregoing technical solutions that, the embodiments of the present application have the following advantages.

The input detection circuit compares the abnormal signal in the input signal with the reference level, and outputs the protection control signal if the pulse amplitude of the abnormal signal is higher than the reference level. After the delay processing performed by the delay circuit, the control circuit controls the power amplifier to be in the off state in the pulse width of the protection control signal that has undergone the delay processing, so that the abnormal signal passes through the power amplifier when the power amplifier is in the off state, thereby preventing the power amplifier from burning, and protecting the power amplifier.

DETAILED DESCRIPTION OF THE EMBODIMENTS

Embodiments of the present application provide a power amplifier protection circuit, communication device, and method, which are used to protect a power amplifier and prevent the power amplifier from burning when an abnormal signal, such as a burr or a pulse, occurs in a circuit.

A power amplifier protection circuit provided in the embodiment of the present application can be further applied in a monitoring system, and is capable of protecting a power amplifier, preventing the power amplifier from burning, and saving a cost. It can be understood that the power amplifier protection circuit can be further applied in another case in which a power amplifier needs to be protected.

Figure 1:
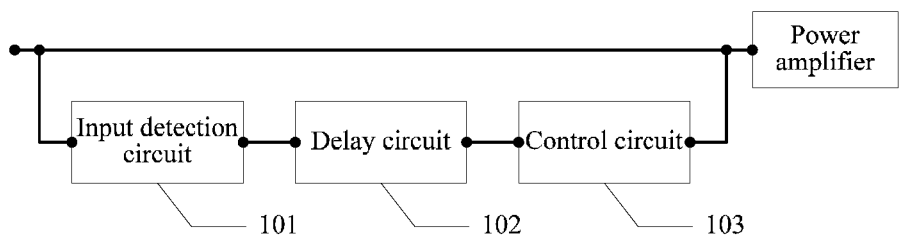
FIG. 1 is an overall schematic view of a power amplifier protection circuit according to an embodiment of the present application.

Referring to FIG. 1, a power amplifier protection circuit according to an embodiment of the present application mainly includes the following parts:

an input detection circuit 101, a delay circuit 102, and a control circuit 103.

An input end of the input detection circuit 101 is connected to a signal input end, and the input detection circuit 101 is configured to detect an abnormal signal in an input signal, compare the abnormal signal with a preset reference level, and output a protection control signal if a pulse amplitude of the abnormal signal is higher than the reference level.

An input end of the delay circuit 102 is connected to an output end of the input detection circuit 101, and the delay circuit 102 is configured to perform delay processing on the protection control signal.

An input end of the control circuit 103 is connected to an output end of the delay circuit 102, and an output end of the control circuit 103 is connected to an input end of a power amplifier, and the control circuit 103 is configured to control the power amplifier to be in an off state in the pulse width of the protection control signal that has undergone the delay processing, so that the abnormal signal passes through the power amplifier when the power amplifier is in the off state.

A power amplifier protection circuit according to an embodiment of the present application is described in detail in the following, and referring to FIG. 2, a power amplifier protection circuit according to an embodiment of the present application includes:

In terms of structure, the input detection circuit 201 includes a comparator and an operational amplifier.

One input end of the comparator loads a signal that is to be detected by the input detection circuit 201, the other input end of the comparator loads a preset reference level, the comparator compares the signal to be detected with the reference level, and if a pulse amplitude of the signal to be detected is higher than the reference level, the comparator outputs a protection control signal.

Exemplarily, a high-speed comparator can increase a comparison and operation speed, thereby reducing delay in signal transmission.

An output end of the comparator is connected to an input end of the operational amplifier, and after an analog signal is converted into an amplified digital signal, the amplified digital signal is output from an output end of the operational amplifier.

The reference level in this embodiment can be determined according to the maximum power of a normal input signal allowed by a system. For example, the maximum power of the normal input signal allowed by the system is 10 dBm, it can be learned that the maximum pulse amplitude of the signal is 1 volt. The reference level in this embodiment can be set slightly higher than the maximum pulse amplitude, for example, 1.1 volt.

It can be understood that, the reference level in this embodiment is described by only taking a specific example, and in a practical application, the reference level can be set according to other data, which is common knowledge to persons of ordinary skills in the art, and is not limited here.

In terms of structure, a delay circuit 202 includes a diode, a resistor, and a capacitor.

The anode of the diode is connected to the input detection circuit 201, and the cathode of the diode is connected to an end of the capacitor. The other end of the capacitor is grounded, the cathode of the diode is connected to a first connecting end of the resistor at the same time, and a second connecting end of the resistor is connected to a control circuit. The delay circuit 202 can perform delay processing on the protection control signal output by the input detection circuit 201, so as to control the time at which the protection control signal reaches a control circuit 203 and control the pulse width of the protection control signal.

It should be noted that, the delay processing can specifically be implemented by adjusting the resistor and the capacitor in the delay circuit 202, where the resistor or the capacitor can be adjusted separately, or the resistor and the capacitor can be adjusted at the same time. The specific adjustment process is related to a practical application process, and is not limited here.

Exemplarily, a Schottky diode is suitable for high-frequency rectification in a scenario of output of a low voltage and a large current, and is used for wave detection and frequency mixing at a very high frequency.

In terms of structure, the control circuit 203 includes a MOS diode.

The gate of the MOS diode is connected to an output end of the delay circuit 202, the drain of the MOS diode is connected to an input end of a power amplifier, and the source of the MOS is grounded. When the protection control signal output by the delay circuit 202 is received, the power amplifier is controlled to be in an off state in the pulse width of the protection control signal that has undergone the delay processing, so that an abnormal signal passes through the power amplifier when the power amplifier is in the off state, and thereby achieving the effect of protecting the power amplifier.

In this embodiment, the process of switching off the MOS is very fast, and the duration of switching is between 10 nanoseconds and 100 nanoseconds, and its working frequency can reach 100 kHz, so a switching speed can be effectively increased.

It should be noted that, in this embodiment, the input detection circuit 201 includes, but is not limited to, a comparator, the delay circuit 202 includes, but is not limited to, a diode, a resistor, and a capacitor; and the control circuit 203 includes, but is not limited to, a MOS diode.

The operation process of a circuit in this embodiment is described in the following.

When an input signal in the circuit is an abnormal signal, such as a pulse and a bun, a comparator compares the abnormal signal with the preset reference level, and outputs a protection control signal if the pulse amplitude of the abnormal signal is higher than the reference level. The protection control signal is converted into an amplified digital signal by an operational amplifier, and the amplified digital signal is output to the anode of a diode. The diode is switched on, a part of the signal is branched through a grounded capacitor, and the rest is transmitted to a resistor. The protection control signal can be delayed by adjusting the resistor and the capacitor, and the protection control signal is output, and is received at the gate of the MOS diode. When the protection control signal is large enough, the drain of the MOS diode is turned on, the MOS diode is in an on state, and the voltage at the input end of a power amplifier is larger than the voltage at the connecting point of the input detection unit, and then a power amplifier protection circuit functions to turn off the connected power amplifier.

In this embodiment, the input detection circuit compares the abnormal signal in the input signal with the reference level, and outputs the protection control signal if the pulse amplitude of the abnormal signal is higher than the reference level. After the delay processing performed by the delay circuit, the control circuit controls the power amplifier to be in the off state in the pulse width of the protection control signal that has undergone the delay processing, so that the abnormal signal passes through the power amplifier when the power amplifier is in the off state, thereby preventing the power amplifier from burning, and achieving the effect of protecting the power amplifier.

Figure 3:
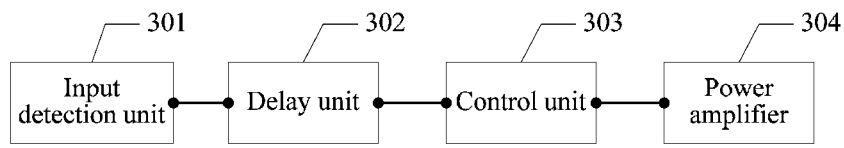
FIG. 3 is a schematic view of a communication device according to an embodiment of the present application.

A communication device is described in the following, and referring to FIG. 3, a communication device provided in this embodiment of the present application includes:

an input detection unit 301, configured to detect an abnormal signal from an input end, and output a protection control signal when a pulse amplitude of the abnormal signal is higher than a preset reference level;

a delay unit 302, configured to perform delay processing on the protection control signal and output the protection control signal;

a control unit 303, configured to control a power amplifier to be in an off state in the pulse width of the protection control signal that has undergone the delay processing, so that the abnormal signal passes through the power amplifier when the power amplifier is in the off state; and a power amplifier 304, configured to generate a power output to drive a load.

Figure 2:
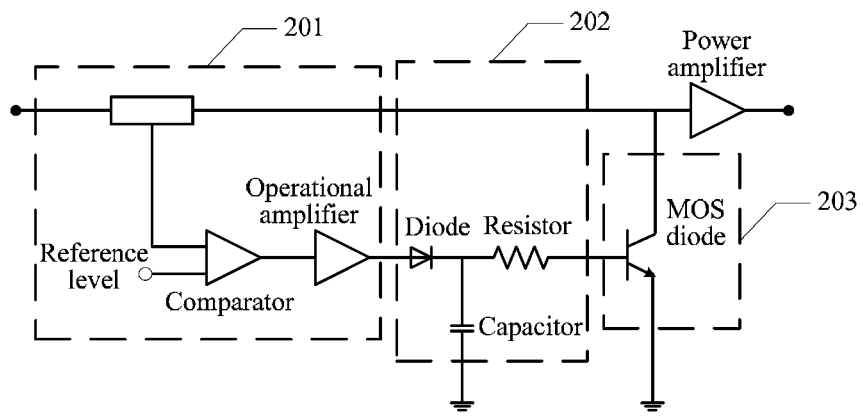
FIG. 2 is a schematic view of a power amplifier protection circuit according to an embodiment of the present application.

Furthermore, the input detection unit 301 includes:

a comparator, in which one input end of the comparator loads a signal that is to be detected, and the other input end loads a reference level, and the reference level is determined according to the maximum power of an input signal, and the specific determination process is the same as that in the description of the embodiment in FIG. 2, and is not described here.

The delay unit 302 includes:

a diode, in which the anode of the diode is connected to the input detection unit 301;

a resistor, in which a first connecting end of the resistor is connected to the cathode of the diode, and a second connecting end of the resistor is connected to the control unit 303; and a capacitor, in which one end of the capacitor is connected to the cathode of the diode and the first connecting end of the resistor, and the other end of the capacitor is grounded.

The control unit 303 includes:

a MOS diode, in which the gate of the MOS diode is connected to the delay unit 302, the drain of the MOS is connected to an input end of the power amplifier, and the source of the MOS is grounded.

For the specific implementation manners of the input detection unit 301, the delay unit 302, and the control unit 303 in the embodiment, reference can be made to the implementation manners shown in FIG. 2, and details are not described here.

Figure 4:
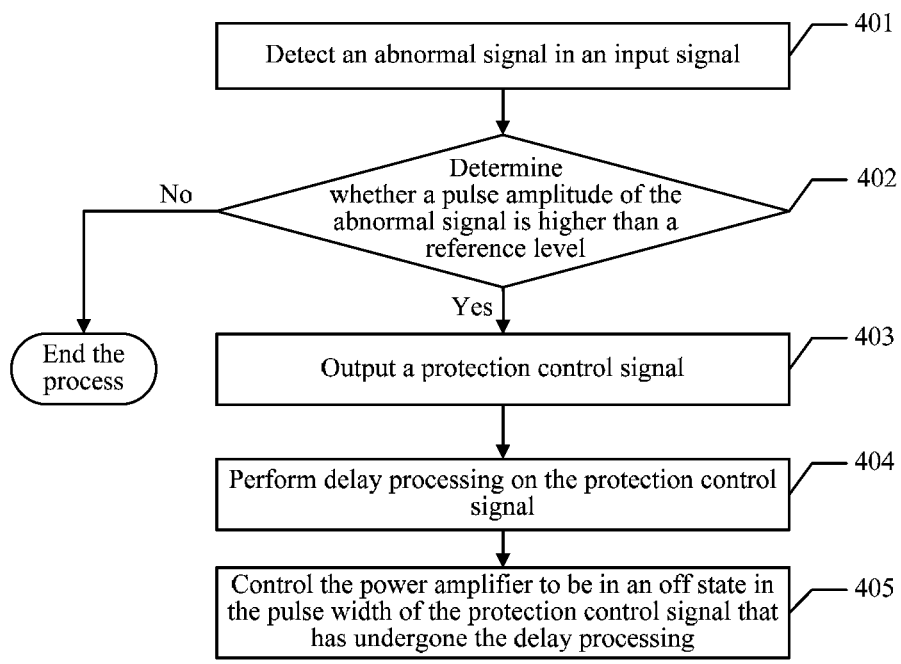
FIG. 4 is a schematic view of a power amplifier protection method according to an embodiment of the present application.

A power amplifier protection method is described in the following, and referring to FIG. 4, a power amplifier protection method provided in an embodiment of the present application includes the following steps.

401: Detect an abnormal signal in an input signal.

An input detection circuit first detects the abnormal signal in the input signal, in which the abnormal signal includes a signal having adverse effect on a power amplifier, such as a pulse and a bun.

402: Determine whether a pulse amplitude of the abnormal signal is higher than a reference level.

When the input detection circuit detects the abnormal signal, the pulse amplitude of the abnormal signal is compared with the reference level, and it is determined whether the pulse amplitude of the abnormal signal is higher than the reference level. If the pulse amplitude of the abnormal signal is higher than the reference level, step 403 is performed.

In this embodiment, the reference level can be determined according to the maximum power of an input signal, and the specific determination process is the same as that in the description of the embodiment in FIG. 2, and is not described here.

403: Output a protection control signal.

When the pulse amplitude of the abnormal signal is higher than the reference level, the input detection circuit outputs the protection control signal.

404: Perform delay processing on the protection control signal.

After a delay circuit receives the protection control signal output by the input detection circuit, the delay processing can be performed on the protection control signal, so as to control the time at which when the protection control signal reaches a control circuit and control the pulse width of the protection control signal, and the specific delay processing process is described in detail in the following.

Figure 5:
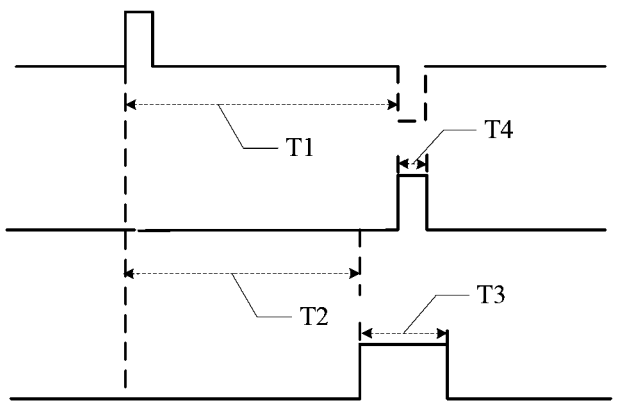
FIG. 5 is a schematic view of the operation timing of a power amplifier protection circuit according to an embodiment of the present application.

Referring to FIG. 5, FIG. 5 is a timing diagram of this embodiment, in which:

T1 refers to a duration required by an abnormal signal to reach a power amplifier through a normal circuit of a system;

T2 refers to a duration required by a protection control signal to reach a control circuit after the protection control signal is generated;

T3 refers to a duration in which the power amplifier is in an off state, namely, a duration of a delayed protection control signal; and T4 refers to the pulse width of the abnormal signal.

T1 is preset during the design of the system, namely, when the circuit has been built, T1 is a fixed value, T2 and T3 can be controlled by a delay circuit, and T4 depends on a reference level, and when the reference level is determined, T4 is determined correspondingly.

In addition, the abnormal signal needs to pass through the normal circuit of the system to reach the power amplifier, but the protection control signal only needs to pass through a power amplifier protection circuit, so the value of T1 is larger than that of T2.

In this embodiment, the protection control signal output by an input detection circuit is the same as an ordinary data signal, and it is assumed that a pulse width is 10 ms when the signal is generated.

T1 refers to the duration required by the abnormal signal to reach the power amplifier through the normal circuit of the system, and is assumed to be 150 ms.

The pulse width of the abnormal signal can be determined by the reference level, and T4 is assumed to be 30 ms.

Both T1 and T4 are relatively fixed values, so during the building of the power amplifier protection circuit, the specific delay process of the delay circuit can be configured according to the values of T1 and T4.

In this embodiment, to make the abnormal signal pass through the power amplifier when the power amplifier is in the off state, the following conditions must be met.

Condition (1): When the abnormal signal reaches the power amplifier, the power amplifier is in the off state.

Condition (2): The power amplifier is switched on after the abnormal signal passes completely.

In a practical application, a control circuit controls to switch on and switch off a power amplifier, and the control circuit can be implemented by a MOS diode. The MOS diode can switch between on and off rapidly, and a required duration is in nanoseconds, so the specific values of T2 and T3 can be set according to the foregoing two conditions without considering the duration.

It is assumed that T2 is 100 ms without considering the delay effect of a delay circuit, and T2 after the delay can be set to 120 ms, and T3 after the delay can be set to 80 ms, namely, as long as T3+T2>=T1+T4, the foregoing condition (1) and condition (2) can be met.

When the power amplifier is in the off state, a normal data signal may be affected. To reduce the effect on the normal data signal, the duration in which the power amplifier is switched off, namely, the value of T3, is optimally reduced as much as possible while the safety of the power amplifier can be guaranteed. In a practical application, the values of T2 and T3 can be adjusted according to "T1=T2+(T3−T4)/2".

After conversion, the foregoing formula is converted to be "T3=2*(T1−T2)+T4", and when T2 is larger than T1, the condition (1) is not met, and the safety of the power amplifier cannot be guaranteed, so when T1 is equal to T2, T3 can take a minimum value.

It should be noted that, only some specific values of T2 and T3 or the setting methods are provided in the foregoing examples. It can be understood that, in practical applications, T2 and T3 can also be set to other values as long as the foregoing condition (1) and condition (2) can be met, and details are not described here.

405: Control the power amplifier to be in the off state in the pulse width of the protection control signal that has undergone the delay processing.

After the control circuit receives the protection control signal output by the delay circuit, controls the power amplifier to be in the off state in the pulse width of the protection control signal that has undergone the delay processing, so that the abnormal signal passes through the power amplifier when the power amplifier is in the off state, thereby preventing the abnormal signal from burning the power amplifier.

In this embodiment, when T2 is 120 ms, and T3 is 80 ms, at the moment of 0120 (in microseconds), the protection control signal reaches the control circuit, the control circuit immediately switches off the power amplifier, and the duration of switching off is 80 ms, namely, at the moment of 0200, the power amplifier is switched on again. At the moment of 0150, the abnormal signal reaches the power amplifier, and the power amplifier is in the off state at the moment. At the moment of 0180, the abnormal signal completely passes through the power amplifier, and the power amplifier is still in the off state at the moment, thereby effectively protecting the power amplifier.

In this embodiment, the power amplifier can be protected against an abnormal signal, and can also be protected against a continuous large signal.

Figure 6:
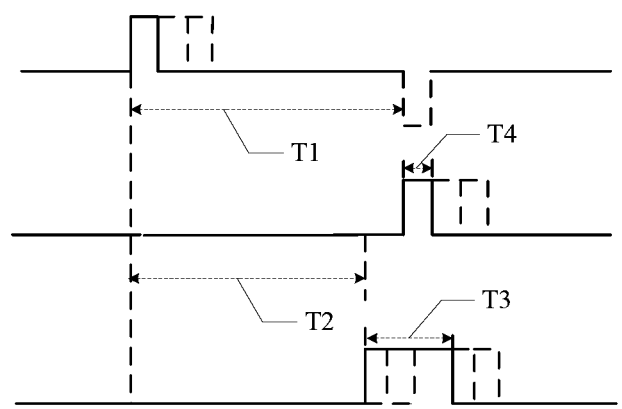
FIG. 6 is another schematic view of the operation timing of a power amplifier protection circuit according to an embodiment of the present application.

For the continuous large signal, the principle of the protection circuit is as follows: the continuous large signal can be divided into many small-pulse-width signals, and for each small-pulse-width signal, the protection circuit can always effectively switch off the power amplifier before the arrival of the small-pulse-width signal. Referring to FIG. 6, the specific meanings of T1, T2, T3, and T4 in FIG. 6 are the same as those in FIG. 5, and are not described here.

Furthermore, the power amplifier in the foregoing embodiment of the present application can be the whole of cascaded power amplifiers, and can also be a final-stage poweramplifier in the cascaded power amplifiers, which is not limited here.

In this embodiment, an input detection circuit compares an abnormal signal in an input signal with a reference level, and outputs a protection control signal if the pulse amplitude of the abnormal signal is higher than the reference level. A delay circuit performs delay processing on the protection control signal, and when the control circuit receives the protection signal, the control circuit controls a power amplifier to be in an off state in the pulse width of the protection control signal that has undergone the delay processing, so that the abnormal signal passes through the power amplifier when the power amplifier is in the off state, thereby preventing the power amplifier from burning, and achieving the effect of protecting the power amplifier, and reducing a cost.

Persons of ordinary skill in the art may understand that all or part of the steps of the method according to the embodiments may be implemented by a program instructing relevant hardware. The program may be stored in a computer readable storage medium, and the storage medium may be a read-only memory, a magnetic disk, an optical disk, or the like.

The power amplifier protection circuit, communication device, and method provided in the present application are described in detail in the foregoing. Persons of ordinary skills in the art can make changes to both the specific implementation and the application scope based on the idea of the embodiments of the present application. In conclusion, the specification should not be construed as a limit to the present application.

What is claimed is:

1. A power amplifier protection circuit, comprising:
an input detection circuit, a delay circuit, and a control circuit; wherein
an input end of the input detection circuit is connected to a signal input end, and the input detection circuit is configured to detect an abnormal signal in an input signal, compare the abnormal signal with a reference level, and output a protection control signal if a pulse amplitude of the abnormal signal is higher than the reference level;
an input end of the delay circuit is connected to an output end of the input detection circuit, and the delay circuit is configured to perform delay processing on the protection control signal and control a pulse width of the protection control signal; and
an input end of the control circuit is connected to an output end of the delay circuit, and an output end of the control circuit is connected to an input end of a power amplifier, and the control circuit is configured to control the power amplifier to be in an off state in a pulse width of a protection control signal that has undergone the delay processing and is output by the delay circuit, so that the abnormal signal passes through the power amplifier when the power amplifier is in the off state.

2. The power amplifier protection circuit according to claim 1, wherein the input detection circuit comprises:
a comparator, wherein one input end of the comparator loads a signal to be detected, and the other input end loads the reference level, and the comparator is configured to compare the signal to be detected with the reference level, and output the protection control signal if a pulse amplitude of the signal to be detected is higher than the reference level, and
the reference level is determined according to maximum power of the input signal.

3. The power amplifier protection circuit according to claim 2, wherein the input detection circuit further comprises:
an operational amplifier, wherein an input end of the operational amplifier is connected to an output end of the comparator, and the operational amplifier is configured to convert the protection control signal being an analog signal into a protection control signal being an amplified digital signal and output the protection control signal being an amplified digital signal from an output end of the operational amplifier.

4. The power amplifier protection circuit according to claim 3, wherein the delay circuit comprises:
a diode, wherein the anode of the diode is connected to the output end of the operational amplifier;
a resistor, wherein a first connecting end of the resistor is connected to the cathode of the diode, and a second connecting end of the resistor is connected to the input end of the control circuit; and
a capacitor, wherein one end of the capacitor is connected to the cathode of the diode and the first connecting end of the resistor, and the other end of the capacitor is grounded.

5. The power amplifier protection circuit according to claim 4, wherein the control circuit comprises:
a MOS diode, wherein the gate of the MOS diode is connected to the second connecting end of the resistor, the drain of the MOS diode is connected to the input end of the power amplifier, and the source of the MOS diode is grounded.

6. The power amplifier protection circuit according to claim 1, wherein the delay circuit comprises:
a diode, wherein the anode of the diode is connected to the output end of the input detection circuit;
a resistor, wherein a first connecting end of the resistor is connected to the cathode of the diode, and a second connecting end of the resistor is connected to the input end of the control circuit; and
a capacitor, wherein one end of the capacitor is connected to the cathode of the diode and the first connecting end of the resistor, and the other end of the capacitor is grounded.

7. The power amplifier protection circuit according to claim 1, wherein the control circuit comprises:
a MOS diode, wherein the gate of the MOS diode is connected to the output end of the delay circuit, the drain of the MOS diode is connected to the input end of the power amplifier, and the source of the MOS diode is grounded.

8. The power amplifier protection circuit according to claim 1, wherein
the power amplifier is a final-stage power amplifier.

9. A communication device, comprising:
an input detection unit, configured to detect an abnormal signal in an input signal, compare the abnormal signal with a reference level, and output a protection control signal if a pulse amplitude of the abnormal signal is higher than the reference level;
a delay unit, configured to perform delay processing on the protection control signal and control a pulse width of the protection control signal;
a control unit, configured to control a power amplifier to be in an off state in a pulse width of a protection control signal that has undergone the delay processing and is output by the delay circuit, so that the abnormal signal passes through the power amplifier when the power amplifier is in the off state; and
the power amplifier, configured to generate a power output to drive a load.

10. The communication device according to claim 9, wherein the input detection unit comprises:
a comparator, wherein one input end of the comparator loads a signal to be detected, and the other input end loads the reference level, and
the reference level is determined according to maximum power of the input signal.

11. The communication device according to claim 10, wherein the input detection unit further comprises:
an operational amplifier, wherein an input end of the operational amplifier is connected to an output end of the comparator, and the operational amplifier is configured to convert the protection control signal being an analog signal into the protection control signal being an amplified digital signal and output the protection control signal being the amplified digital signal from an output end of the operational amplifier.

12. The communication device according to claim 11, wherein the delay unit comprises:
a diode, wherein the anode of the diode is connected to the output end of the operational amplifier;
a resistor, wherein a first connecting end of the resistor is connected to the cathode of the diode, and a second connecting end of the resistor is connected to an input end of a control circuit; and
a capacitor, wherein one end of the capacitor is connected to the cathode of the diode and the first connecting end of the resistor, and the other end of the capacitor is grounded.

13. The communication device according to claim 12, wherein the control unit comprises:
a MOS diode, wherein the gate of the MOS diode is connected to the second connecting end of the resistor, the drain of the MOS diode is connected to an input end of the power amplifier, and the source of the MOS diode is grounded.

14. The communication device according to claim 9, wherein the delay unit comprises:
a diode, wherein the anode of the diode is connected to an output end of the input detection unit;
a resistor, wherein a first connecting end of the resistor is connected to the cathode of the diode, and a second connecting end of the resistor is connected to the control unit; and
a capacitor, wherein one end of the capacitor is connected to the cathode of the diode and the first connecting end of the resistor, and the other end of the capacitor is grounded.

15. The communication device according to claim 9, wherein the control unit comprises:

a MOS diode, wherein the gate of the MOS diode is connected to an output end of the delay unit, the drain of the MOS diode is connected to an input end of the power amplifier, and the source of the MOS diode is grounded.

16. A power amplifier protection method, comprising:

detecting an abnormal signal in an input signal;

comparing the abnormal signal with a reference level, and outputting a protection control signal if a pulse amplitude of the abnormal signal is higher than the reference level;

performing delay processing on the protection control signal to control a pulse width of the protection control signal; and controlling a power amplifier to be in an off state in a pulse width of a protection control signal that has undergone the delay processing and is output by a delay circuit, so that the abnormal signal passes through the power amplifier when the power amplifier is in the off state.

17. The method according to claim 16, wherein the performing the delay processing on the protection control signal comprises:

delaying the protection control signal, to make a pulse width T3 of the delayed protection control signal meet the following condition:

$$T3 >= T1 - T2 + T4;$$

wherein

T1 is a duration required by the abnormal signal to reach the power amplifier, T2 is a duration required by the protection control signal to reach a control circuit, T4 is a pulse width of the abnormal signal, and T1 is larger than or equal to T2.

18. The method according to claim 17, wherein the pulse width T3 is specifically obtained in the following manner:

$$T3 = 2*(T1 - T2) + T4.$$

19. The method according to claim 16, wherein
the reference level is determined according to maximum power of the input signal.

20. The method according to claim 16, wherein
the power amplifier is a final-stage power amplifier.

* * * * *